United States Patent

[11] 3,627,589

[72] Inventor James W. Sprague
Clay, N.Y.

[21] Appl. No. 24,626
[22] Filed Apr. 1, 1970
[45] Patented Dec. 14, 1971
[73] Assignee General Electric Company

[54] METHOD OF STABILIZING SEMICONDUCTOR DEVICES
3 Claims, 4 Drawing Figs.

[52] U.S. Cl. .......... 148/1.5, 148/33.3, 148/187
[51] Int. Cl. .......... H01l 7/34
[50] Field of Search .......... 148/1.5, 187, 188, 189, 13, 20.3, 33.3

[56] References Cited

UNITED STATES PATENTS

| | | | |
|---|---|---|---|
| 3,453,154 | 7/1969 | Wycislak | 148/1.5 |
| 3,472,703 | 10/1969 | Ono et al. | 148/1.5 |

*Primary Examiner*—Richard O. Dean
*Attorneys*—Robert J. Mooney, Nathan J. Cornfeld, Frank L. Neuhauser, Oscar B. Waddell and Joseph B. Forman

ABSTRACT: This invention relates to a method of minimizing the effects of mobile impurity ions in an insulating layer formed on a semiconductor body of silicon material. Initially the semiconductor body is placed under a reduced ambient pressure of less than $10^{-3}$ torr. While under this reduced pressure ambient the insulating layer is heated to a temperature in the range of 950° to 1150° C. for a time sufficient to minimize the deleterious effects of mobile impurity ions present in the insulating layer. The body is then heated in the presence of hydrogen at a temperature in the range between 250° to 550° C. for a time sufficient to minimize the effects of fast interface defects at the insulating layer-silicon interface.

INVENTOR:
JAMES W. SPRAGUE,
BY Robert J. Mooney
HIS ATTORNEY.

METHOD OF STABILIZING SEMICONDUCTOR DEVICES

My invention relates to a method of stabilizing the electrical characteristics of an insulated gate field-effect transistor (IG-FET) particularly such devices in which a refractory metal is used to form the gate.

Field-effect transistors of the insulated gate type, in general, include a pair of opposite conductivity type discrete regions adjacent to a major surface of a one conductivity type, monocrystalline semiconductor body, wherein the discrete regions, known as source and drain, are separated by a narrow channel region which lies beneath an insulation layer topped by a gate electrode. Conduction between the source and drain regions occurs through the surface-adjacent channel and is modulated by a potential applied to the gate electrode.

During the fabrication of such field-effect transistors, surface-adjacent regions are diffused into the semiconductor body with activator impurities to form the source and drain regions of opposite conductivity type from that of the main body of the semiconductor wafer and to establish source and drain PN-junctions. By way of example, this can be accomplished by forming a suitable passivating layer such as silicon dioxide on the surface of the wafer, etching away portions of the silicon dioxide film, diffusing the preselected dopant into the discrete regions exposed when the oxide has been etched away to thereby form the source and drain regions, and then redepositing a layer of silicon dioxide or another passivating material at least over the previously exposed apertures in the oxide. Suitable contacts are then made to the drain, source and gate by techniques well known to those skilled in the art.

This method of fabricating the IG-FET devices, however, has a number of disadvantages. For example, the passivating layer, so formed, is inferior because contaminants are introduced into the passivating layer during the reoxidation step. Furthermore, it is extremely difficult to precisely register the gate electrode relative to the source and drain junctions once the reoxidation step is complete. If such precise registration is not obtained, the exposed channel region will constitute a very high resistance and will require a high threshold voltage (i.e., the voltage required to invert the surface of the silicon under the gate region thereby forming the channel) to turn the device on since at zero gate bias there are very few majority carriers in the channel region. Additionally, such imprecise registration increases the feedback capacitance (Cdg) between drain and gate, resulting in an undesirable increase in the gate capacitance which limits the operating speed and, hence, the operating frequency of the device.

To overcome the above problems, an alternative method of self-registration of the insulating gate can be employed based on the use of a refractory metal as a gate and as a diffusion mask, when necessary. This is accomplished by forming the gate of the IG-FET at the same time the channel-adjacent portion of the source and drain regions are defined.

Initially, a conductive layer of a refractory metal such as molybdenum is patterned by well-known photoresist and etching techniques to provide a pattern over the surface of an insulator layer which is formed upon a semiconductive substrate such as silicon from which IG-FET devices are to be fabricated. The conductive layer is patterned, so as to facilitate simultaneous formation of the channel-adjacent source and drain regions and formation of the gate. More simply stated, the patterned conductive layer, including the gate, serves both as an etch mask to facilitate removal of the insulating layer from the surface of the regions at which the source and drain are to be formed, and may, in addition, serve as a diffusion mask by which the source and drain regions are formed. A gate portion of the conductive layer is positioned over the channel between the source and drain regions. This gate portion is later contacted during fabrication and functions as the gate contact pad. This multiple utilization of the patterned conductive layer automatically forms the channel-adjacent source and drain junctions in perfect registry with the gate.

Although such self-registered gate IG-FET devices using a refractory metal have a number of distinct advantages such as higher speed and less feedback capacitance, they are not without some disadvantages. For instance, it has been found that when using a refractory metal such as molybdenum or tungsten during the fabrication cycle there is a considerable reduction in the electrical stability of the device due to the apparent presence of mobile impurity ions of either polarity which may exist in the refractory metal prior to deposition and subsequently contaminate the insulating layer. Some examples of mobile impurity ions include alkali ions such as sodium, lithium and potassium, hydrogen ions and hydroxyl ions. In addition, there may also be mobile impurity ions already present in the insulating layer which were introduced during previously completed processing steps.

The total number of mobile impurity ions present in the insulating layer are best determined by measuring the change in the flat band voltage of a metal-insulator-silicon (MIS) device between its value when the device is under a stressed condition and its value when the device is under an unstressed condition. The greater the shift in flat band voltage the larger the number of mobile impurity ions present in the insulating layer. Flat band voltage, in such an MIS structure, is defined as the voltage which must be applied to the gate electrode relative to the semiconductor electrode, so that, on an energy level diagram graphing energy levels as a function of distance normal to the silicon-insulator interface, the conduction and valence bands at such interface are straight (i.e., perpendicular to the interface). The unstressed condition simply involves measuring the flat band voltage at room temperature. The stressed condition, on the other hand, involves placing both a thermal and electrical stress on the metallic gate electrode of the MIS structure. The thermal stress is then removed and the structure allowed to cool to room temperature (the electrical stress is maintained at all times) at which time the flat band voltage is measured again to determine if any shift in the flat band voltage occurred since the first measurement at room temperature. One preferred set of stress conditions consists of thermal stressing the structure at 300° C. for 1 minute while maintaining an electrical stress of +15 volts on the metallic gate electrode.

Under these stressed conditions the mobile impurity ions are collected at the silicon-insulator interface and their presence is determined by measuring the shift in flat band voltage.

For desired stability of operation of such device in service under varying temperature and voltage stress conditions it is of course desirable to minimize such shifts in flat band voltage. However previous attempts to treat such devices so as to minimize such shifts in flat band voltage have introduced fast interface defects, which in turn deleteriously affect the operating characteristics, as for example by causing a high threshold voltage.

Accordingly, it is an object of my invention to provide a method to electrically stabilize semiconductor devices of the IG-FET type by minimizing the deleterious effects of the presence of mobile impurity ions in the insulating layer of the device by substantially reducing the quantity of mobile impurity ions.

Another object is to provide such a method which minimizes the formation in such devices of residual fast interface defects.

Another object is to provide such a method which insures highly reproducible results.

These and other objects of this invention will be apparent from the following description and the accompanying drawings, wherein.

Briefly, my invention relates to a method of reducing the presence of mobile impurity ions in an insulating layer formed on a semiconductor body of silicon material. Initially the semiconductor body is placed under a reduced ambient pressure of less than $1\times10^{-3}$ torr. In this vacuum the insulating layer is baked by being heated to a temperature between 950° and 1,150° C. for a time sufficient to drive off the mobile impurity ions present in the insulating layer. The mobile impurity ions are collected on a relatively cool metallic surface (i.e., a surface having a temperature no higher than about 150° C.) which is spaced about 1 foot from the semiconductor body. The body is then heated in the presence of hydrogen at a temperature in the range between 250° C. and 550° C. for a time sufficient to reduce the presence of fast interface defects of both polarities which are introduced in the insulating layer during the initial heating step. The amphoteric nature of the fast interface defect and the symmetry of the interface state energy levels suggest that they can be thought of as being levels taken out of the conduction and valence band continuum by the discontinuties experienced by the silicon bonds at the surface. High temperature vacuum heating of oxidized silicon wafers is capable of producing a very high density of donor and acceptor fast interface energy levels.

Figure 1:
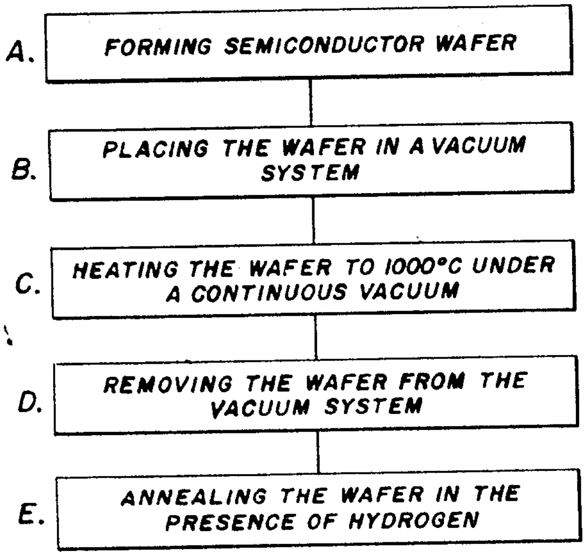
FIG. 1 is a schematic flow diagram of the main steps of a process according to my invention.
Figure 4:
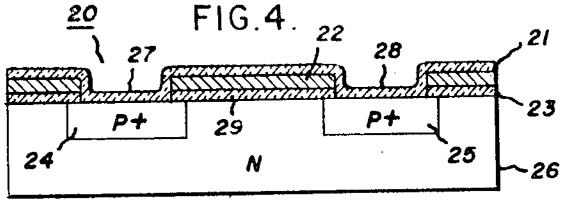
FIG. 4 is an enlarged cross-sectional view of a typical IG-FET semiconductor device.

FIG. 1 refers to a flow diagram of steps A–E of one preferred embodiment of my invention. Step A relates to the formation of a plurality of semiconductor pellets in a semiconductor wafer to which my invention is applicable. My process will be described in terms of a single pellet 20 (shown in FIG. 4) of silicon prior to its being subdivided from a parent wafer. Pellet 20 constitutes only a small portion of a wafer of silicon semiconductor material, and it will be understood that the procedures described may be accomplished on the entire wafer where desired. The pellet structure 20 provides in Step A an insulated gate field-effect transistor (IG-FET) which is formed using a self-registered insulating gate technique. Initially an insulating silicon dioxide layer 23 of between 3,000 to 25,000 angstroms thickness is formed on top of the silicon substrate 26 whose conductivity type may be, for example, N. A gate dielectric aperture (not shown) is then made in the oxide layer 23 exposing a portion of the top surface of the substrate 26. A thin gate dielectric layer 29, which can also be silicon dioxide, of about 1,000 angstroms thickness, is then deposited in the gate dielectric aperture and covered with a layer 22 of refractory material such as molybdenum or tungsten, the latter also covers the remainder of the top surface of the pellet 20. It is, of course, recognized that other insulating material such as silicon nitride or silicon oxynitride can also be used for layers 23 and 29 either alone or in combination with silicon dioxide. Using photomasking and etching techniques well known to those skilled in the art the metallic electrode gate 22 is defined as well as the drain and source apertures 27 and 28.

A suitable source of conductivity type determining impurity material, such as for example, a borosilicate glass layer 21 containing a P-conductivity type dopant, is then deposited over the entire top surface of the N-type wafer 26. The pellet 20 is then treated with sufficient heat to drive the P-type dopant into the substrate 26 thus simultaneously forming the drain 24 and the source 25. All the foregoing techniques used in forming the structure 20 are known to those skilled in the art, and therefore no further description of them is deemed necessary.

Figure 2:
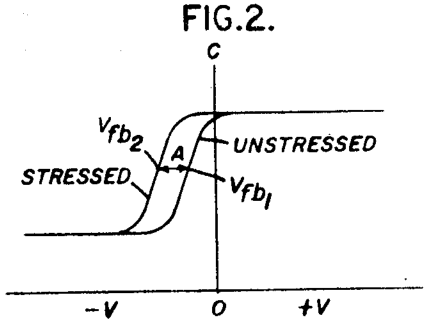
FIG. 2 is a graph of voltage (applied to the metal gate electrode) vs. capacitance (across the dielectric layer) curves for a nonstressed and stressed IG-FET device, which is useful in measuring and displaying the electrical stability of a particular device.

It is theorized that during the various fabrication steps used to form semiconductor structures such as device 20, mobile impurity ions are introduced in the insulating layers 23 and 29 thereby deleteriously affecting the electrical stability of the device. This effect on electrical stability is evidenced, for example, as a large shift in the flat band voltage when measured in an unstressed and stressed condition. The stressed curve is established by subjecting the dielectric layer of device 20 to a thermal stress of 300° C. and a potential stress on the gate electrode of +15 volts. The thermal stress of 300° C. is removed after 1 minute and the structure is allowed to cool to room temperature at which time the flat band voltage is measured again. Typically this shift in flat band voltage, namely "A," the difference between $V_{fb1}$ and $V_{fb2}$ as shown in FIG. 2 without benefit of my invention, ranges from 2 to 3 volts to greater than 30 volts. Those devices having the benefit of my invention have shifts which, under comparable conditions of stress, are significantly decreased. The $c(v)$ curve in FIG. 2, for purposes of illustration, is for N-type silicon, however, a similar measuring procedure could be used to determine a $c(v)$ curve for P-type silicon which would also allow the determination of the shift in flat band voltage, namely "A," with the exception that the $c(v)$ curves, would be flipped over. Those devices having the benefit of my invention have shifts which, under comparable conditions of stress, are significantly decreased.

Figure 3:
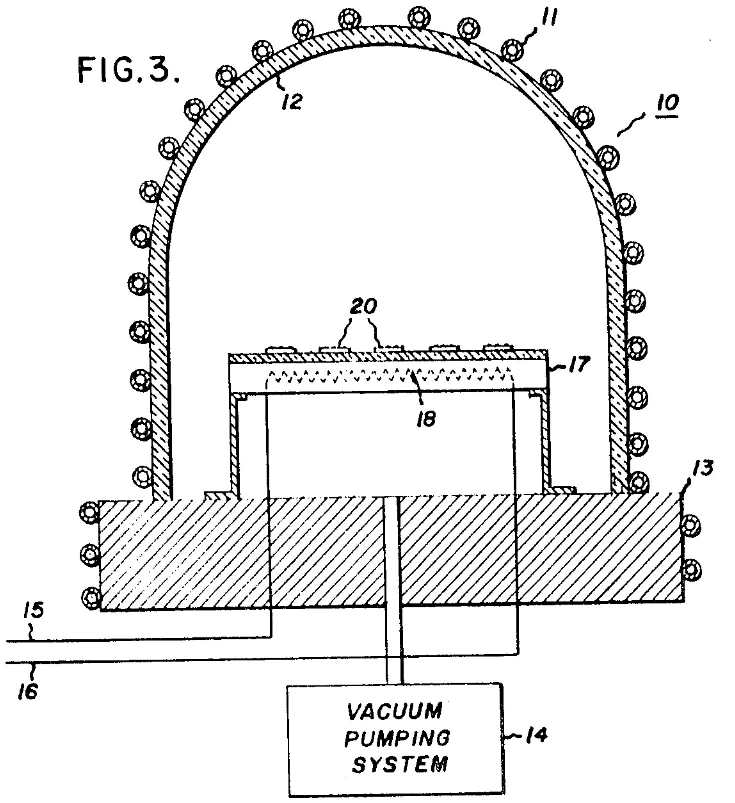
FIG. 3 is a cross-sectional view of an apparatus useful in the performance of my invention.

In accordance with a preferred Step B of my invention the wafers containing pellets identical to 20 are placed in a suitable vacuum system. A typical embodiment of such a vacuum system 10 is shown in FIG. 3. The vacuum system 10 includes a metallic baseplate 13 and a metallic bell jar 12 which are water cooled by coils 11. Preferably, the plate 13 and the bell jar 12 are kept below a maximum temperature of 150° C. Attached to the baseplate 13 is a vacuum pumping system capable of maintaining less than $1\times10^{-3}$ torr in the bell jar region. The wafers containing the pellets 20 are placed on a suitable holder 17 which is preferably made of tantalum or molybdenum. The wafers on holder 17 are heated to temperatures between 950° and 1,150° C. by a heater 18 made of tantalum or molybdenum. Heater 18 is located directly below the wafers in holder 17 and is energized through leads 15 and 16. Cooling of bell jar 12 and baseplate 13 are desirable because it is theorized that as the mobile impurity ions are driven off the device they are more effectively absorbed on a cooled surface.

After the reduced pressure of less than $1\times10^{-3}$ torr is obtained the pellet 20 is heated, as indicated in Step C in FIG. 1, to a temperature between 950° C. and 1,150° C. During Step C the pellet 20 in the practice of my invention experiences a reduced pressure ambient between $10^{-3}$ torr and $10^{-8}$ torr. At reduced pressure less than $10^{-8}$ no appreciable improvement in the benefit of my invention is seen. The time the pellet 20 is maintained at this predetermined temperature and reduced pressure can be varied from about 1 hour to 5 hours, dependent on the number of mobile impurity ions present in the insulating layers 23 and 29. It appears that after 1 hour the benefit of my invention (i.e., a reduced flat band voltage shift) can be measured using the stressed-nonstressed techniques previously described. The flat band voltage shift continues to decrease until after about 5 hours, after which time no further reduction in the magnitude of the flat band voltage shift can be measured even with up to twenty hours of further heating. Although normally, prior to Step C, the contacts to the gate 22, source 24 and drain 25 in the pellet 20 are not yet formed, when the metal selected for forming the contacts does not alloy with silicon at the temperature the pellet 20 is subjected to under the vacuum, namely 950° to 1,150° C., the contacts can be fabricated prior to Step C. The techniques for forming these contact regions are well known to those skilled in the art and are not part of my invention.

Upon completion of Step C, the pellet 20 is removed from the vacuum system according to Step D. Due to the introduction of fast interface defects in the insulating layers 23 and 29 during Step C a subsequent heating Step E is used. Step E requires that the pellet 20 be heated to a temperature of between 250° and 550° C. in the presence of hydrogen (5 percent by volume hydrogen minimum, the remainder an inert gas such as nitrogen) for about 1 hour. After 1 hour of such heat treatment, no appreciable reduction in the presence of fast interface defects at the insulating layers-silicon interface appears to take place, even after 16 hours. The presence of fast interface defects are measured by determining the difference between the flat band voltage of the pellet 20 at room temperature and its flat band voltage measured at liquid nitrogen temperature, namely 77° K.

EXAMPLE I a. Four wafers consisting of pellets having a structure identical to pellet 20 in FIG. 4 including a 16 mil diameter molybdenum gate were placed in a vacuum system under a reduced pressure of $10^{-3}$ torr and heated to 1,000° C. for from 1 to 5 hours. This treatment was then followed by a hydrogen heat treatment (5 percent by volume hydrogen and 95 percent by volume nitrogen) at 500° C. for 1 hour. Temperatures ranging from 250° C.–550° C. were also tried with no appreciable difference in results.

b. Upon completion of the vacuum-heating treatment the shifts in flat band voltage were measured. This is accomplished by taking the difference between the flat band voltage measured at room temperature in the unstressed condition and the flat band voltage measured at room temperature after a thermal stress of 300° C. under an electrical stress of +15 volts was applied to the gate electrode for one minute and then removed. Once thermal stress of 300° C. is removed, the device while still under the +15 volts electrical stress is allowed to cool to room temperature, where the flat band voltage is measured again. The results obtained are shown in table 1 and reflect an improvement over an average original flat band voltage shift of at least 25 volts.

TABLE 1

Flat Band Voltage Shift (volts)

| Sample No. | 1 hour | 3 hours | 5 hours |
|---|---|---|---|
| 1 | −10 | −5 | −0.3 |
| 2 | −6.5 | −3 | −0.1 |
| 3 | −5.9 | −1.6 | −0.5 |
| 4 | −3.8 | −0.9 | −0.05 |

EXAMPLE II a. The procedure of example I*a* was repeated on four more identical wafers except that the pressure was reduced to $10^{-7}$ torr.

b. The procedure of example I*b*. was repeated and the results obtained are shown in table 2.

TABLE 2

Flat Band Voltage Shift (volts)

| Sample No. | 1 hour | 3 hours | 5 hours |
|---|---|---|---|
| 1 | −10 | −1.3 | −0.2 |
| 2 | −7.3 | −1.0 | −0.2 |
| 3 | −7.5 | −2.5 | −0.4 |
| 4 | −2.0 | − 0.3 | −0.3 |

EXAMPLE III a. Two wafers consisting of pellets having a structure identical to pellet 20 in FIG. 4 including a 16 mil diameter molybdenum dot were placed in a vacuum system under a reduced pressure of $10^{-3}$ torr, heated to 930° C. for 3 hours, removed from the vacuum system and heat treated in hydrogen (5 percent hydrogen by volume and 95 percent by volume) at 500° C. for 1 hour. The flat band voltage shift of each wafer was then measured following the procedure of example I*b*. The wafers were then placed back in the vacuum system and the above process repeated except that the temperature was raised to 1,000° C. and kept there for 2 additional hours. Similarily, temperatures up to 1,150° C. were used with no appreciable change in results.

b. The procedure of example I*was repeated and the results are shown in table* 3.

TABLE 3

Flat Band Voltage Shift (volts)

| Sample No. | 930° C. 3 hours | 1,000° C. 2 additional hours |
|---|---|---|
| 1 | −20 | −0.36 |
| 2 | −24 | −0.73 |

EXAMPLE IV a. Two wafers consisting of pellets having an identical structure to pellet 20 in FIG. 4 including a 16 mil diameter molybdenum dot were placed in a vacuum system under a reduced pressure of $10^{-8}$ torr, heated to 950° C. for 5 hours, removed from the vacuum system and heat treated in hydrogen (5 percent by volume hydrogen and 95 percent by volume nitrogen) at 500° C. for 1 hour. The flat band voltage shift of each wafer was then measured following the procedure of example I*b*. The wafers were then placed back in the vacuum system and the above process repeated except that the temperature was raised to 1,000° C. and kept there for 2 additional hours.

b. The procedure of example I*b* was repeated and the results are shown in table 4.

TABLE 4

Flat Band Voltage Shift (volts)

| Sample No. | 950° C./5 hours | 1000° C./2 additional hours |
|---|---|---|
| 1 | −0.67 | −0.2 |
| 2 | −0.30 | −0.2 |

EXAMPLE V a. A IG-FET wafer was prepared having an insulating gate oxide of about 1,000 angstroms by techniques well known to those skilled in the art. The wafer was then placed in a vacuum system under a reduced pressure of $10^{-7}$ torr and heated to 1,000° C. for 5 hours. The insulating gate was then formed with aluminum using conventional techniques. This treatment was followed by heating the wafer in the presence of hydrogen (5 percent by volume hydrogen and 95 percent by volume nitrogen) at 500° C. for about 1 hour.

b. The flat band voltage in the stressed and unstressed condition and the difference between them were then determined using the procedure of example I*b*.

c. The results indicated that the stability of the device, i.e., the flat band voltage shift remained normal at about 0.5 volts, however, the magnitude of each individual stressed and unstressed flat band voltage reading was closer to the theoretical flat band voltage (this voltage is determined by mathematical calculations and assumes the presence of no mobile impurity ions in the insulating layer) of the device which is desirable because the lower the flat band voltage the lower the threshold voltage required to turn the MIS device on.

EXAMPLE VI a. Two identical IG-FET wafers having a molybdenum-silicon nitride-silicon dioxide-silicon structure were prepared by techniques well known to those skilled in the art.

b. One wafer was heated in a conventional ambient of 95 percent by volume nitrogen and 5 percent by volume hydrogen at 1,000° C. for 5 hours and had a flat band voltage shift of −10.7 volts when stressed at 300° C., and +15 volts for 1 minute per procedure used in example I*b*.

c. The other wafer was placed in a reduced pressure of $10^{-7}$ torr and heated to 1,000° C. for 5 hours followed by a heat treatment step

What I claim as new and desire to secure by Letters Patent of the United States is:

1. A method for minimizing the effects of mobile impurity ions and/or fast interface defects in an insulating layer formed on a semiconductor body of silicon material comprising the steps of:

placing the semiconductor body under a continuous reduced pressure of less than $1\times10^{-3}$ torr;

heating the insulating layer formed on the body while under the reduced pressure ambient, to a value between 950° to 1,150° C. for a time sufficient to minimize the deleterious effects of mobile impurity ions present in the insulating layer; and heating the semiconductor body in the presence of hydrogen at a temperature in the range between 250° to 550° C. for a time sufficient to minimize the effects of fast interface defects at the insulating layer silicon interface.

2. A method of stabilizing the electrical characteristics of an insulated gate field-effect transistor having an insulating layer formed on a body of semiconductor material by substantially reducing the presence of mobile impurity ions and/or fast interface defects at the insulating layer-semiconductor interface comprising the steps of:

placing the semiconductor body under a continuous reduced pressure of between $10^{-3}$ and $10^{-8}$ torr;

heating the semiconductor body while under the reduced pressure to a temperature between 950° C. and 1,150° C. for at least 1 hour to drive off the mobile impurity ions;

providing a cool metallic surface having a temperature no greater than 150° C. to collect the mobile impurity ions as they are driven off; and heating the semiconductor body in the presence of hydrogen at a temperature in the range of 250°–550° C. for at least 1 hour.

3. A method of reducing the flat band voltage shift for an IG-FET semiconductor device formed in a semiconductor body having on its top surface an insulating layer comprising the steps of:

placing the semiconductor body under a continuous reduced pressure of less than $1\times10^{-3}$ torr;

heating the insulating layer formed on the body while under the reduced pressure ambient, to a value between 950° to 1,150° C. for a time sufficient to minimize the deleterious effects of mobile impurity ions present in the insulating layer; and heating the semiconductor body in the presence of hydrogen at a temperature in the range between 250° to 550° C. for a time sufficient to minimize the effects of fast interface defects at the insulating layer semiconductor interface.

* * * * *